United States Patent
Lo et al.

(10) Patent No.: US 6,864,141 B1
(45) Date of Patent: Mar. 8, 2005

(54) METHOD OF INCORPORATING NITROGEN INTO METAL SILICATE BASED DIELECTRICS BY ENERGIZED NITROGEN ION BEAMS

(75) Inventors: Wai Lo, Lake Oswego, OR (US); James P. Kimball, Troutdale, OR (US); Verne C. Hornback, Camas, WA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/453,118

(22) Filed: Jun. 3, 2003

(51) Int. Cl.[7] .................. H01L 21/283; H01L 21/31
(52) U.S. Cl. .................. 438/287; 438/761; 438/763; 438/765
(58) Field of Search ................. 438/761–775, 438/785, 786, 591–596, 216, 287

(56) References Cited

U.S. PATENT DOCUMENTS

| | | | | |
|---|---|---|---|---|
| 4,986,841 A | * | 1/1991 | Oyoshi et al. | 65/30.13 |
| 5,414,301 A | * | 5/1995 | Thomas | 257/740 |
| 5,541,131 A | * | 7/1996 | Yoo et al. | 438/305 |
| 5,970,350 A | * | 10/1999 | Gardner et al. | 438/287 |
| 6,020,024 A | * | 2/2000 | Maiti et al. | 427/248.1 |
| 6,020,243 A | * | 2/2000 | Wallace et al. | 438/287 |
| 6,027,961 A | * | 2/2000 | Maiti et al. | 438/199 |
| 6,033,998 A | | 3/2000 | Aronowitz et al. | |
| 6,057,584 A | * | 5/2000 | Gardner et al. | 257/411 |
| 6,087,229 A | | 7/2000 | Aronowitz et al. | |
| 6,159,873 A | * | 12/2000 | Takagi | 438/795 |
| 6,271,818 B1 | | 8/2001 | Yamazaki et al. | |
| 6,287,897 B1 | * | 9/2001 | Gousev et al. | 438/142 |
| 6,291,867 B1 | * | 9/2001 | Wallace et al. | 257/410 |
| 6,348,373 B1 | * | 2/2002 | Ma et al. | 438/240 |
| 6,376,888 B1 | * | 4/2002 | Tsunashima et al. | 257/407 |
| 6,413,386 B1 | * | 7/2002 | Callegari et al. | 204/192.23 |
| 6,413,881 B1 | | 7/2002 | Aronowitz et al. | |
| 6,451,701 B1 | * | 9/2002 | Wang et al. | 438/705 |
| 6,495,474 B1 | * | 12/2002 | Rafferty et al. | 438/766 |
| 6,524,651 B2 | * | 2/2003 | Gan et al. | 427/255.27 |
| 6,613,658 B2 | * | 9/2003 | Koyama et al. | 438/591 |

OTHER PUBLICATIONS

Kato et al, "Effect of post nitriding on electrical properties of high permittivity hafnium and zirconium silicate films", Proceedings 7th International Conference on Properties and Application of Dielectric Materials, Jun. 2003, pp. 765–768.*

Interface.T1.com EE Times article, "*Researchers advance on high–k battleground,*" Feb. 22, 2002, by Mike Clendenin, available online at: http://www.eetimes.com/printableArticle?doc_id=OEG20020222S0046 (2 pages).

EETimes.com article, "IBM preps two 0.13–micron process technologies," Jun. 21, 2000, by David Lammers, available online at: http://www.eetimes.com/story/OEG20000621S0038 (4 pages).

* cited by examiner

*Primary Examiner*—Michael Lebentritt
(74) *Attorney, Agent, or Firm*—Maginot, Moorge & Beck

(57) ABSTRACT

A method of making a thin gate dielectric includes providing a metal silicate on a silicon substrate. Nitrogen is implanted into the metal silicate.

21 Claims, 12 Drawing Sheets

METHOD OF INCORPORATING NITROGEN INTO METAL SILICATE BASED DIELECTRICS BY ENERGIZED NITROGEN ION BEAMS

TECHNICAL FIELD OF THE INVENTION

The present invention relates generally to semiconductor fabrication, and more particularly to a dielectric layer used in semiconductor fabrication.

BACKGROUND OF THE INVENTION

Metal-oxide semiconductor (MOS) devices generally include a large number of transistors on a semiconductor wafer. Such transistors each include a source, a gate and a drain. The source and the drain are created on a semiconductor substrate. The gate is separated from both the source and the drain by a dielectric in the form of an electrically nonconductive gate oxide layer, which is disposed on the semiconductor substrate. A voltage applied to the gate produces an electric field that changes the resistivity of the semiconductor substrate, thereby inducing current between the source and the drain.

FIGS. 1A through 1C illustrate steps in a conventional semiconductor fabrication process on a portion of a semiconductor wafer 100. In FIG. 1A, a semiconductor substrate 101 is shown. The substrate 101 has a gate oxide layer 104, which functions as a gate dielectric layer, formed on its upper surface 102. The gate oxide layer 104 may be created in ways well known to those of skill in the art. For example, the gate oxide layer 104 may be composed of silicon dioxide ($SiO_2$) generated by thermal oxidation of surface 102 of the silicon substrate 101. Alternatively, the gate oxide layer 104 may be deposited on the silicon substrate 101 by chemical vapor deposition (CVD). Typical conventional gate oxide layer thicknesses are about 15 to 200 Angstroms.

As shown in FIGS. 1B and 1C, a doped polysilicon (poly) layer 106 is typically deposited over the gate oxide layer 104 in order to provide the material from which a gate electrode may be formed. The doped polysilicon layer 106 can be deposited over the gate oxide layer 104 by in situ doped CVD or undoped CVD followed by implantation and annealing, for example. FIG. 1B shows the wafer 100 with the poly layer 106 on the gate oxide layer 104.

FIG. 1C shows the wafer 100 after the poly layer 106 has been patterned and etched to form a gate electrode 108, according to methods well known in the art. The gate electrode 108 may then be used as a mask in a self-aligned implant process that penetrates through the gate oxide layer 104 to produce doped active source 110 and drain 112 regions in the substrate 101, on either side of the gate electrode 108, thereby forming an MOS transistor.

As semiconductor technology has developed, semiconductor device geometries have been reduced. As a result, the various components that make up a semiconductor have been decreased in size. As device sizes decrease, gate dielectric layers in such devices should correspondingly become thinner. In addition to being more compact in size, thinner gate dielectrics have the advantage of providing more capacitance between the gate electrode 108 and the silicon substrate 101, thereby reducing the voltage at the gate electrode 108 that is required to induce current between the source 110 and the drain 112. Thus, thinner gate dielectrics improve the performance of the device.

A problem, however, with thinner gate dielectric layers is that such layers allow more leakage current. A thinner gate dielectric layer provides a shorter current path between the gate electrode and the semiconductor substrate. The shorter current path results in a correspondingly lower electrical resistance between the gate electrode and the semiconductor substrate. The lower resistance, in turn, allows greater leakage current between the gate electrode and the semiconductor substrate. More specifically, there is greater leakage current between the gate electrode 108 and the source 110 and/or between the gate electrode 108 and the drain 112. Ideally, a MOS transistor and other semiconductor devices have no leakage current.

Leakage current is undesirable because leakage current results in wasted power that requires additional cooling of the device. Another problem caused by leakage current is that device speed is decreased. The leakage current creates an element of random noise in the signal between the source and the drain. In order to detect the signal between the source and the drain with a requisite degree of certainty, the magnitude of the signal must be allowed rise substantially above the level of the noise. The rise of the signal between the source and the drain is not instantaneous, but rather occurs over a non-negligible amount of time. Thus, the higher the signal must rise in order to be detected, the more time it takes to be detected, thereby reducing the overall speed of the device.

Another problem with thinner gate dielectric layers is that, at high temperatures, such layers allow the penetration of gate electrode dopants through the dielectric layers and into the silicon substrate. More particularly, dopants such as boron may penetrate through the gate-electrodes 108, through the dielectric gate oxide layer 104, and into the channels in the silicon substrate 101.

Dopant penetration into the silicon substrate is undesirable because it can lead to hot electron degradation and the reduction of the breakdown resistance of the gate oxide. Such penetration of dopants into the silicon channels causes a depletion of dopants at the interfaces between the gate-electrodes 108 and the dielectric layer 104, and results in a reduction of charge carriers in that region. This charge depletion effect (poly depletion effect) frequently leads to the apparent increase in the electrical thickness of the dielectrics and degrades the performance of the CMOS devices.

Techniques have been developed to address the problems of high leakage current and dopant penetration into the silicon substrate in high performance CMOS devices. For instance, a known improvement in the manufacture of thin gate dielectrics includes forming the thin gate dielectrics of silicon oxynitrides ($SiO_xN_y$) having less than 10% nitrogen. Advantages of introducing nitrogen into the thin gate dielectric include reducing boron diffusion into the silicon substrate. Although forming the thin gate dielectrics of silicon oxynitride addresses the problem of dopant penetration into the silicon substrate, it does not solve the other problem of high leakage current.

One of the major requirements of thin gate dielectrics in CMOS devices is that their gate leakage current densities be less than 1 Amp/$cm^2$ at room temperature. The mechanism governing the magnitude of the leakage current for ultra-thin silicon oxynitride at room temperature is Fowler-Nordheim tunneling.

It is desirable for the gate length, i.e., the length L of the gate electrode 108 in FIG. 1C, to be as small as possible in order to minimize the size of the device. Gate lengths of 70 nm have been achieved in "70 nm technology node" transistors. A problem, however, is that the shorter the gate length is, the thinner the dielectric 104 must be in order for the device to have an acceptable level of capacitance. The thickness of the dielectric, in turn, has an inverse relationship with the leakage current. Thus, the thinner dielectric layers associated with shorter gate lengths result in greater leakage current, which is, of course, undesirable. Experimental results have shown that leakage currents are increased by an order of magnitude for every 2 Angstroms reduction in the thickness of the dielectric.

From these experimental results it can be estimated that the continued use of silicon oxynitride gate dielectrics for 70 nm technology node transistors will result in leakage currents above 50 Amp/cm$^2$, which is above the acceptable level of leakage current for 70 nm technology node transistors.

It has been found that the leakage current can be reduced by using a dielectric material including a metal silicate (e.g., $Zr_xSi_{1-x}O_2$, $Hf_xSi_{1-x}O_2$) instead of silicon oxynitride. The metal silicate does not reduce dopant penetration into the silicon substrate, however, with the same effectiveness as does the silicon oxynitride. The metal silicate has a higher dielectric constant (K value) than the silicon oxynitride. A dielectric material with a higher dielectric constant provides correspondingly higher capacitance between the gate electrode 108 and the silicon substrate 101, as is well known in the art. As discussed above, the capacitance has an inverse relationship with the thickness of the dielectric. By using the metal silicate, having a higher dielectric constant, instead of the silicon oxynitride to form the dielectric layer, it is thus possible to form the dielectric layer with a greater thickness, thereby decreasing leakage current, while still maintaining the same dielectric properties, i.e., providing the same capacitance.

One of the important considerations in using silicates is the choice of the ratio between metals and silicon, since this ratio determines the value of the dielectric constant of the silicate. For example, the K value of $Hf_{0.2}Si_{0.8}O_2$, which is a medium K dielectric, is about twice that of silicon oxynitride or $SiO_2$. Thus, a silicon oxynitride dielectric having a thickness of 12–13 Angstroms (which is about the appropriate thickness for a 70 nm node device) can be replaced by an $Hf_{0.2}Si_{0.8}O_2$ dielectric having a thickness of 25 Angstroms. The $Hf_{0.2}SiO_{0.8}O_2$ dielectric can be said to have an equivalent thickness or equivalent oxide thickness (EOT) of 12–13 Angstroms. That is, an $Hf_{0.2}Si_{0.8}O_2$ dielectric having a thickness of 25 Angstroms provides the same capacitance as a silicon oxynitride dielectric having a thickness of 12–13 Angstroms. Such use of a metal silicate dielectric has been demonstrated to be effective in reducing the gate leakage current.

The increased dielectric thickness of 25 Angstroms that is made possible by the use of a metal silicate as the dielectric material is still not sufficient to prevent the penetration of gate electrode dopants through the dielectrics at high temperatures. As mentioned above, introducing nitrogen into silicon dioxide inhibits dopant penetration through the dielectric. It has been found that the degree of dopant penetration through metal silicate dielectrics can also be suppressed by the incorporation of nitrogen into the metal silicates. Thus, the inclusion of both nitrogen and metal in the dielectric material can result in a device having acceptable levels of both current leakage and dopant penetration.

Similar to the role of nitrogen in silicon dioxide, there are certain requirements imposed on both the percentage and the spatial distribution of nitrogen in metal silicates if the performance of the MOS devices is to be acceptable. A low percentage of nitrogen is not sufficient for blocking dopant penetration. Conversely, a high percentage of nitrogen can result in excessive charge trapping. Thus, a first requirement when incorporating nitrogen into a metal silicate dielectric is that the percentage incorporation of nitrogen be within a desired range.

Although a small percentage of nitrogen at the interface between the dielectric layer 104 and the silicon substrate 101 can improve the performance of the devices, too much nitrogen at the interface degrades channel mobility, and hence worsens performance. Thus, a second requirement when incorporating nitrogen into a metal silicate dielectric is that the spatial distribution profile of nitrogen in the dielectrics (i.e., how deeply the nitrogen penetrates into the dielectrics) be controlled.

A third requirement when incorporating nitrogen into a metal silicate dielectric comes into effect when the associated CMOS device is to be included in a triple gate system. A triple gate system is characterized by the co-existence of CMOS transistors with three different thicknesses of gate dielectrics on the same integrated circuit chip. The gate can be formed by depositing and patterning a layer of polysilicon, similar to the polysilicon layer 106, so that the polysilicon layer covers an oxide-coated silicon body on top and both sides. The silicon body is similar to the silicon substrate 101, and the oxide coating is similar to the gate oxide layer 104.

A triple gate system includes three types of CMOS devices on the same integrated circuit, with each type of CMOS device having a different and respective dielectric thickness. The CMOS devices have different dielectric thicknesses because the CMOS devices have different applications and different performance (i.e., capacitance) requirements. That is, some of the devices have lower performance requirements and thicker dielectrics, while others are designed for higher performance and have thinner dielectrics.

Only the CMOS devices having the highest performance requirements include thin gate dielectrics formed exclusively of metal silicates. Some lower performance CMOS devices in the triple gate system include gate dielectrics that are thicker and that have properties providing proven performance reliability, and thus their properties should be preserved.

However, the presence of nitrogen affects the properties of a dielectric. Hence, in order to avoid changing the known and desirable properties of the established thicker gate dielectrics, which are not formed exclusively of metal silicates, additional nitrogen should not be introduced into these established gate dielectrics. Thus, a third requirement when incorporating nitrogen into dielectrics is that nitrogen be preferentially incorporated into the dielectrics formed exclusively of metal silicates instead of into the other thicker gate dielectrics which may al so include silicon dioxide or silicon oxynitride.

There are two known techniques for incorporating nitrogen into semiconductor devices, neither of which satisfies each of the three requirements discuss ed above. The first technique is to introduce nitrogen on bare silicon wafers through $NH_3$ annealing before the deposition of a dielectric layer. A first problem with this approach is that it results in too much nitrogen at the interface between the dielectric layer and the silicon substrate, and thus degrades channel mobility. For this reason, $NH_3$ annealing does not meet the second requirement described above. A second problem with this approach is that nitrogen is indiscriminately incorporated into all of the gate dielectrics. Thus, $NH_3$ annealing also does not meet the third requirement described above.

The second technique involves nitrogen plasma treatment from the top surface of the dielectric. This second technique avoids degrading channel mobility and, when used in conjunction with an annealing process, is potentially capable of incorporating nitrogen selectively. However, it is difficult to control the nitrogen dose. Th us, nitrogen plasma treatment does not meet the first requirement described above. Further, it is also difficult to control the spatial distribution of the nitrogen. Thus, nitrogen plasma treatment also does not meet the third requirement described above.

Although the incorporation of nitrogen into semiconductor devices is known to be beneficial, problems are created by all of the known techniques for implementing such an incorporation of nitrogen into a semiconductor device, as described above. Thus, a continuing need exists for a method of incorporating nitrogen into metal silicate based dielectrics that meets all of the three requirements described above. More particularly, what is needed in the art is a method of incorporating nitrogen into metal silicates that results in a favorable percentage incorporation of nitrogen, that allows the spatial distribution profile of nitrogen in the dielectric to be controlled, and that allows the nitrogen to be incorporated preferentially into dielectrics formed only of metal silicates rather than into the other thicker gate dielectrics.

SUMMARY OF THE INVENTION

The present invention provides a method of incorporating nitrogen into metal silicate based dielectrics in which the dosage of the nitrogen is relatively closely controlled within a desired range, the spatial distribution profile of the nitrogen in the dielectric is controlled, and the nitrogen is discriminately and preferentially incorporated into the exclusively metal silicate dielectrics rather than into the other thicker gate dielectrics. More particularly, the present invention includes implanting nitrogen into the dielectric by use of energized nitrogen ion beams.

In accordance with one embodiment of the present invention, there is provided a method of making a thin gate dielectric. A metal silicate is provided on a silicon substrate. Nitrogen is implanted into the metal silicate.

In accordance with another embodiment of the present invention, there is provided a method of making a thin gate dielectric. A dielectric is provided on a silicon substrate. Nitrogen ions are implanted into the dielectric. The dielectric with the implanted nitrogen is annealed.

In accordance with yet another embodiment of the present invention, a thin gate dielectric is created by the steps of providing a metal silicate on a silicon substrate, implanting nitrogen into the metal silicate, and annealing the metal silicate.

The above and other features and advantages of the present invention will become apparent from the following description and the attached drawings.

DETAILED DESCRIPTION OF A PREFERRED EMBODIMENT

The method of fabricating thin layer gate dielectrics of the present invention will now be described with reference to a preferred embodiment. Important properties and characteristics of the preferred embodiment are illustrated in the structures in the text and in the accompanying drawings. While the invention will be described in conjunction with this preferred embodiment, it should be understood that the invention is not intended to be limited to this preferred embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides a method for fabricating metal silicate based thin gate dielectrics having nitrogen incorporated therein for 50–70 nm node CMOS transistors. The method includes nitrogen ion implantation into metal silicates, followed by thickness adjustment through dilute hydrogen fluoride etching.

The present invention provides a technique for incorporating nitrogen into metal silicate based dielectrics with the capability to control the dose and spatial distribution profile of the nitrogen in the dielectrics. This technique is also suitable for selecting the location of nitrogen incorporation.

FIGS. 2A–K show stages in the fabrication of a dielectric including a metal silicate according to a preferred embodiment of the present invention, including a double gate scheme. The fabrication process involves growth of a layer of oxide on a semiconductor wafer, masking the gate dielectric areas that are to include thicker gate dielectrics, etching of the oxide on the areas that are to include thin gate dielectrics, stripping of the mask on the thicker gate dielectric areas, deposition of a metal silicate layer on the wafer, again masking the gate dielectric areas that are to include thicker gate dielectrics, implantation of nitrogen into the metal silicate and the mask, stripping of the mask, followed by rapid thermal annealing of the nitrogen incorporated silicate, and finally adjustment of the thickness of the silicate by etching.

Figure 1A:
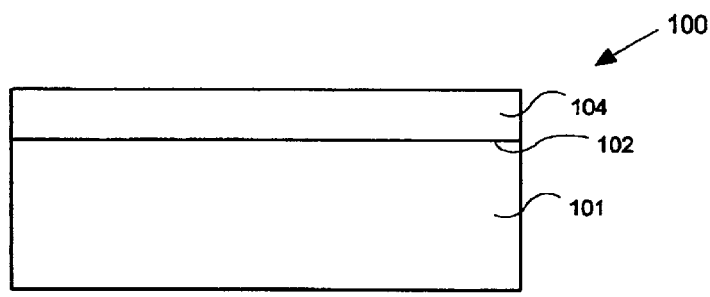
FIGS. 1A–C depict cross-sectional views of stages in the conventional fabrication of a semiconductor device.
Figure 1B:
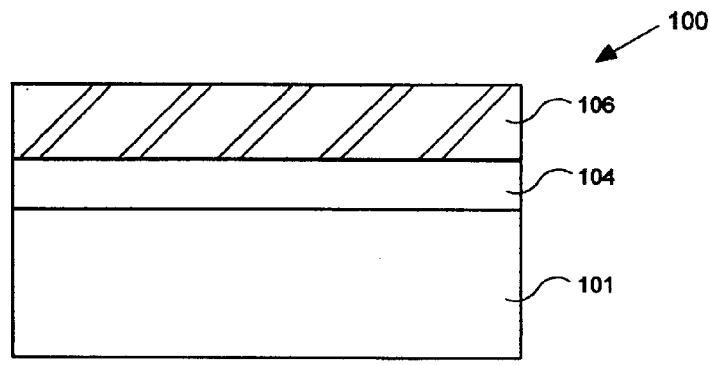
Figure 1C:
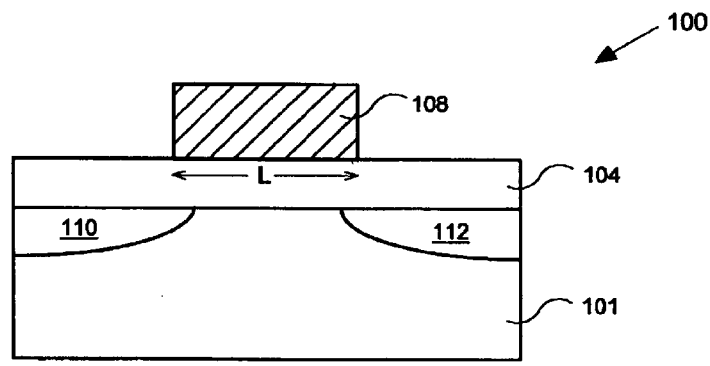
Figure 2A:
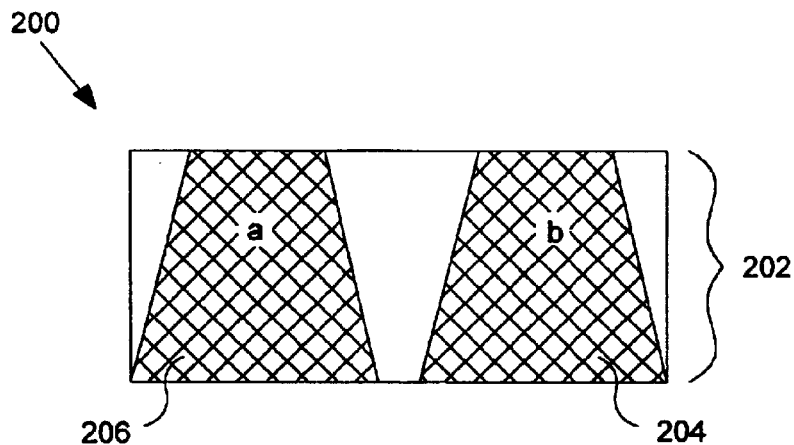
FIGS. 2A–K depict cross-sectional views of stages in the fabrication of a metal silicate based dielectric with nitrogen incorporated therein according to a preferred embodiment of the present invention.
Figure 2B:
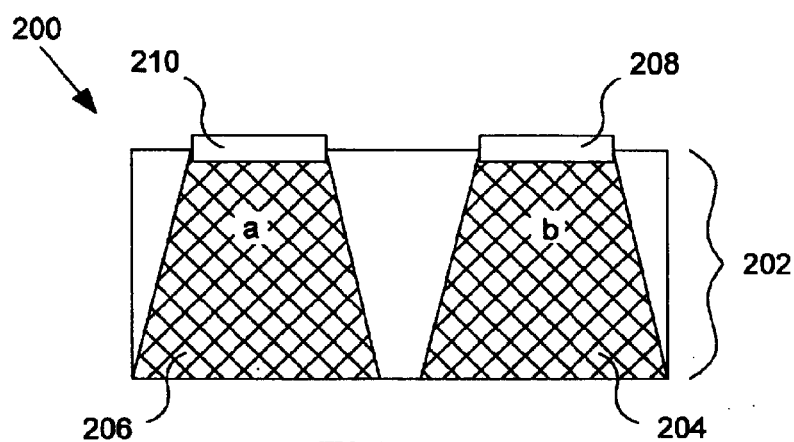
Figure 2C:
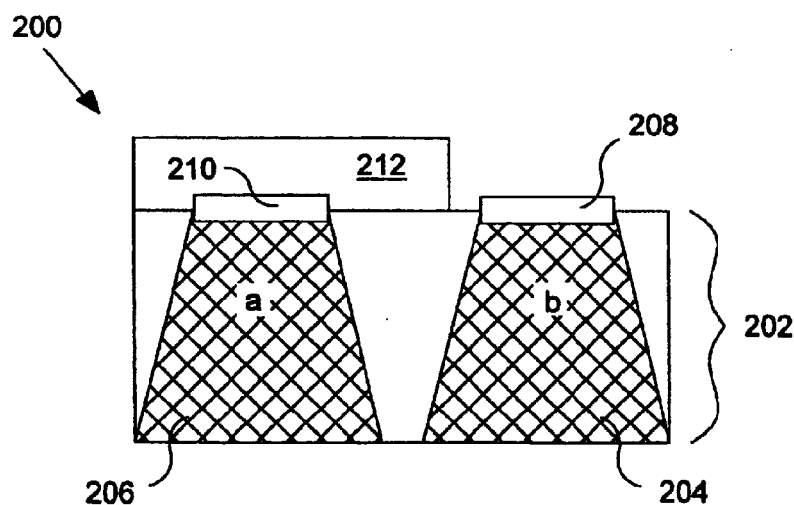
Figure 2D:
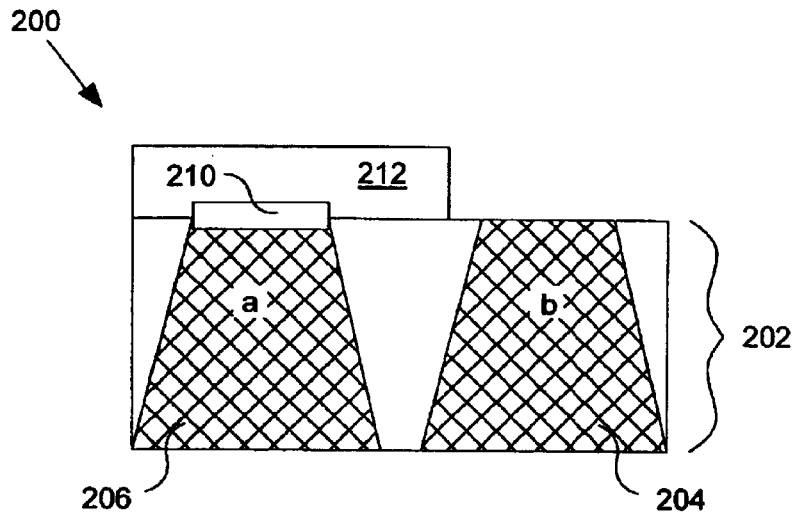
Figure 2E:
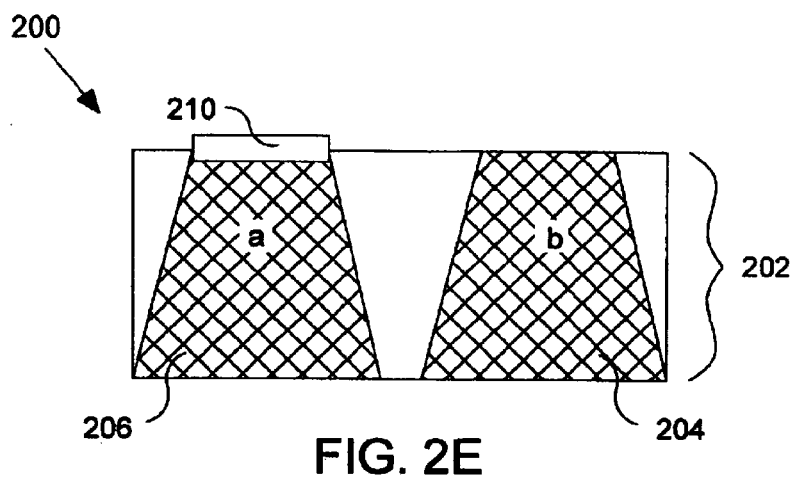
Figure 2F:
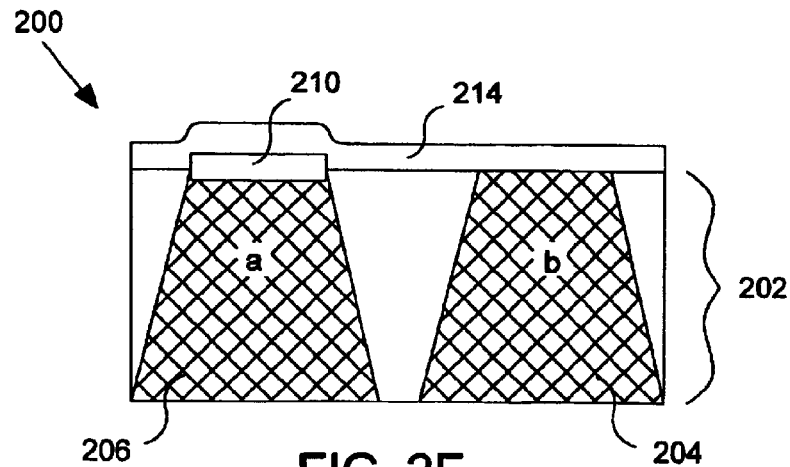
Figure 2G:
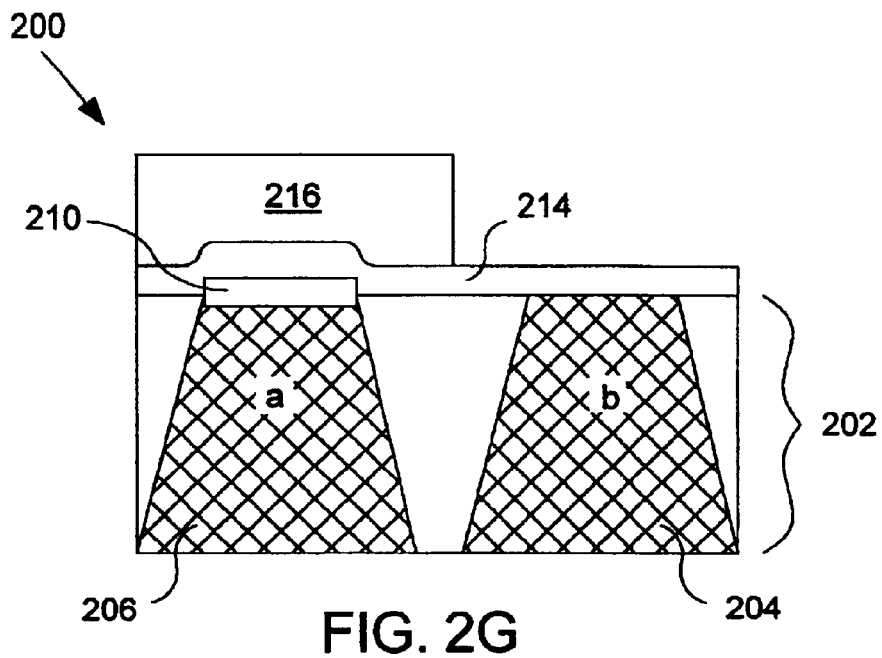
Figure 2H:
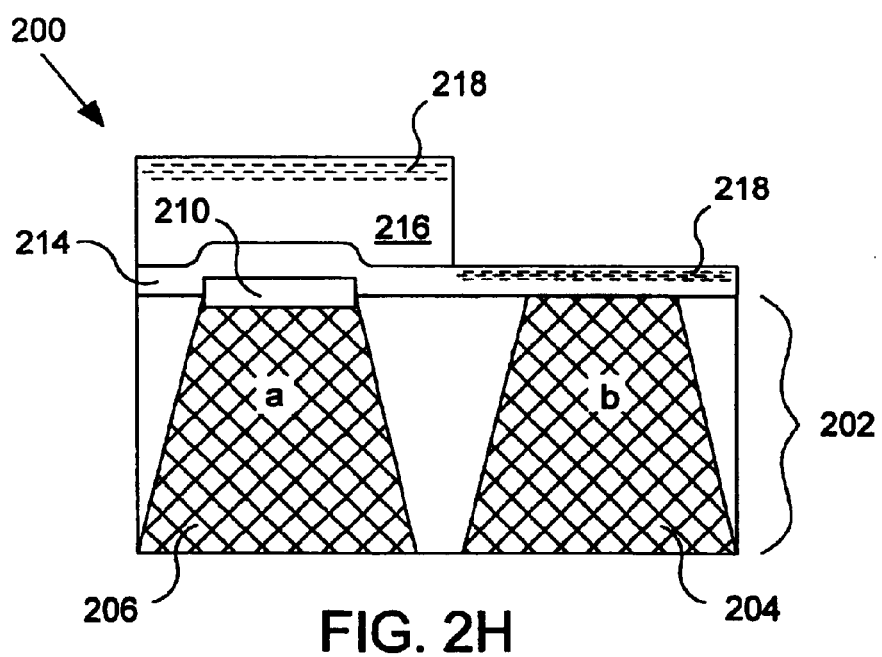
Figure 2I:
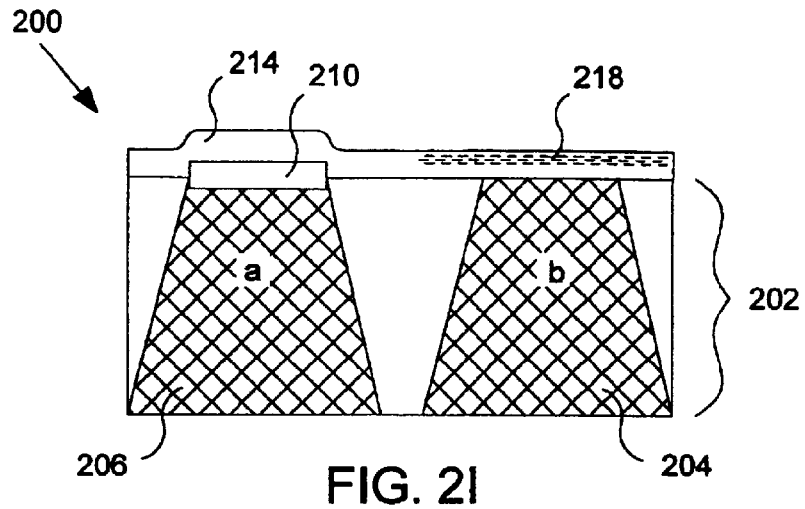
Figure 2J:
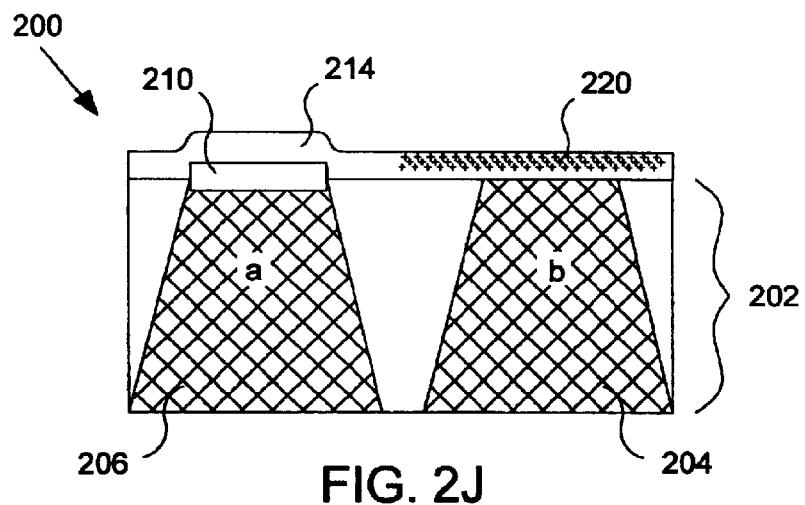
Figure 2K:
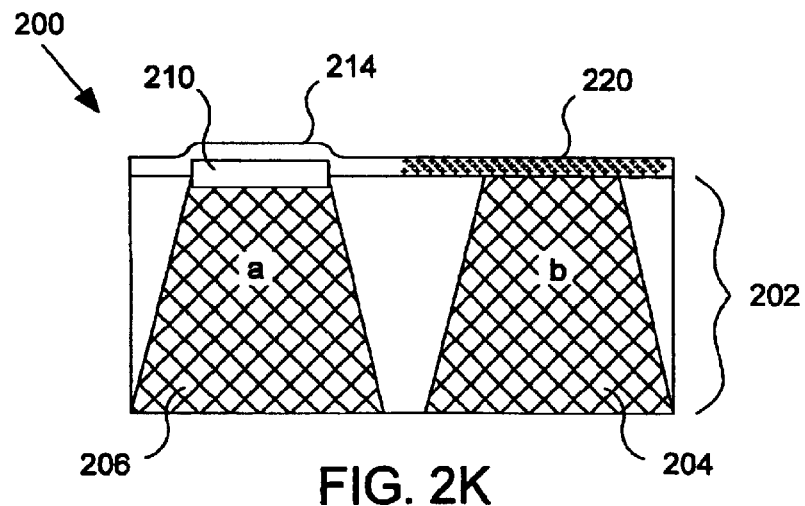
Figure 3:
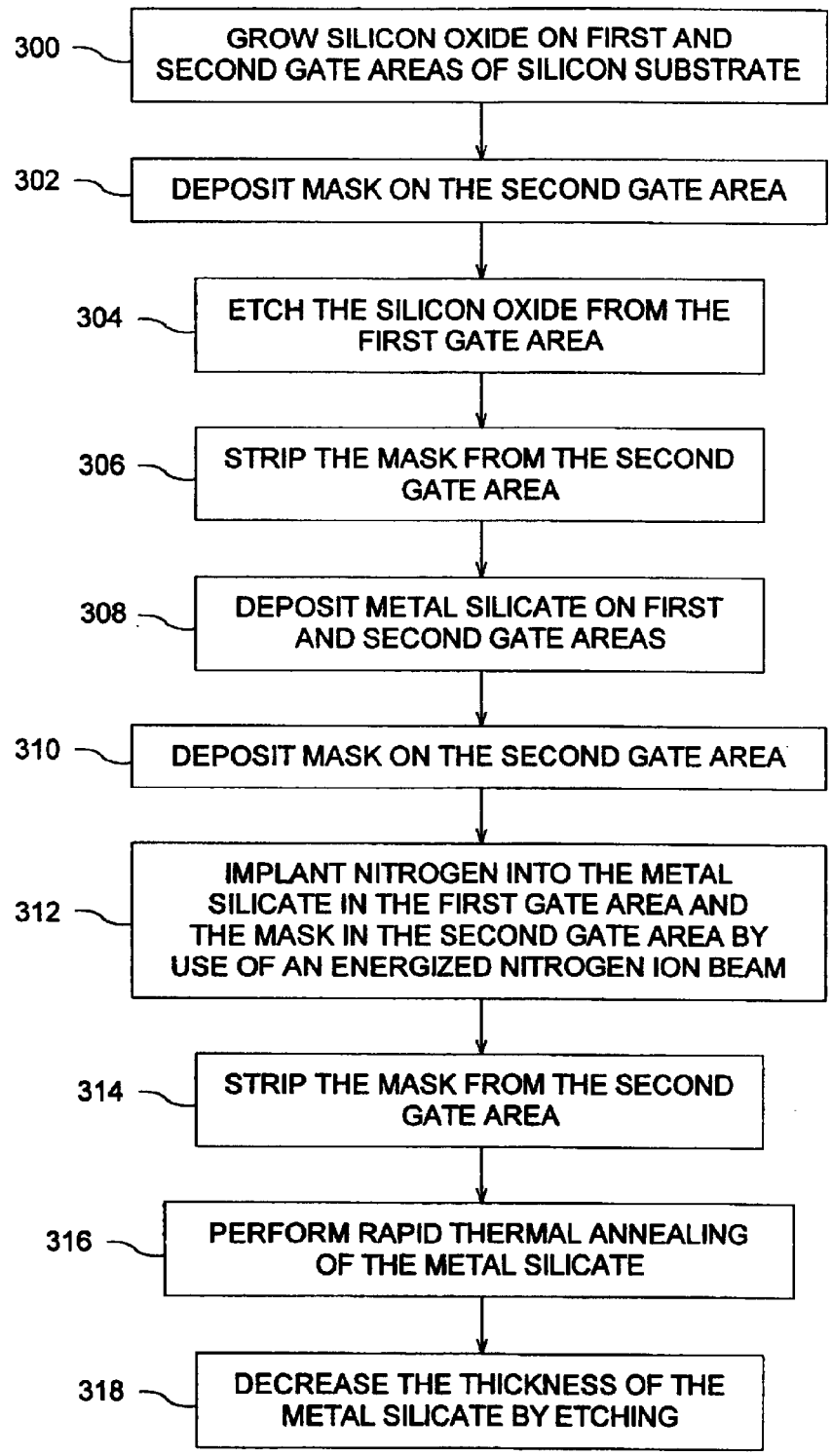
FIG. 3 is a flow chart of the preferred embodiment of the present invention depicted in FIGS. 2A–K.

FIG. 3 shows a flow diagram of operations used to form the stages of FIGS. 2A–K. The steps of FIG. 3 and the stages of FIGS. 2A–J will be described concurrently herein.

In FIG. 2A, a portion of a patterned and cleaned semiconductor wafer 200 is shown. The wafer 200 includes a gate area substrate 202, preferably composed of single crystal silicon. In a first stage of this preferred embodiment, a plurality of first island areas or first gate areas 204 of the substrate 202 and a plurality of second island areas or second gate areas 206 of the substrate 202 are identified by a designer of the integrated circuit chip of which the wafer 200 will be a part. Only one first gate area 204 and one second gate area 206, which are laterally separated from each other, are shown in FIGS. 2A–J for ease of illustration. Each first gate area 204 is to include a thin metal silicate dielectric, while each second gate area 206 is to include a thicker dielectric including both a layer of silicon oxide and a layer of metal silicate.

As shown in FIG. 2B, thick layers 208, 210 of silicon dioxide ($SiO_2$) or silicon oxynitride (SiON) are deposited or grown on the first gate area 204 and the second gate area 206, respectively (step 300; FIG. 3). In one embodiment, the layers 208, 210 each have a thickness of approximately 45 Angstroms. Next, as shown in FIG. 2C, a mask 212 is deposited on the silicon oxide layer 210 by a known technique (step 302). The mask 212 can be comprised, for example, of a metal material or a photoresist material.

In a next step (step 304), the silicon oxide layer 208 is etched off of or otherwise removed from the first gate area 204, as shown in FIG. 2D. The mask 212 is then stripped from the silicon oxide dielectric layer 210, as indicated in FIG. 2E (step 306). After the mask 212 has been stripped, a top, exposed surface of the wafer 200 can be cleaned to remove any impurities.

As shown in FIG. 2F, a metal silicate based dielectric layer 214 is deposited or otherwise formed on the top surface of the wafer 200 to thereby cover the first and second gate areas 204, 206 (step 308). The metal silicate can be in the form of $HfSiO_x$, for example. The layer 214 can be formed with a pre-selected metal-to-silicon ratio and a thickness of between 30 Angstroms and 50 Angstroms. The layer 214 can be formed with any of various techniques, such as metal organic chemical vapor deposition (MOCVD), atomic layer deposition (ALD), or physical vapor deposition (PVD).

A mask 216 (FIG. 2G) is deposited by a known technique on a portion of the metal silicate based dielectric layer 214 that is disposed above the second gate area 206 (step 310). The mask layer 216 can be comprised, for example, of a metal material or a photoresist material.

Next, as shown in FIG. 2H, nitrogen 218 is implanted into both the mask layer 216 and the unmasked portion of the metal silicate based dielectric layer 214 by energized nitrogen ion beam implantation (step 312). The ion implantation is performed with a dosage approximately between $10^{12}$ atoms/$cm^2$ and $10^{15}$ atoms/$cm^2$ and an ion energy approximately between 0.2 keV and 5.0 keV. The ion implantation can be performed at room temperature. The mask 216 prevents the nitrogen from being implanted into the metal silicate in the second gate area, where the nitrogen could change the known and desirable properties of the thicker gate dielectric.

The implantation of the nitrogen ions into the dielectric layer 214 does not result in the nitrogen ions being chemically incorporated into the dielectric layer 214. That is, the nitrogen ions are not bonded with the silicate. The nitrogen ions are schematically depicted as horizontal dashes 218 in FIG. 2H in order to indicate their unincorporated nature. Because the nitrogen ions are unincorporated, they function as defects in the dielectric layer 214.

The implantation of nitrogen into the dielectric layer 214 is described herein as being achieved by use of at least one ion beam. However, it is also possible, within the scope of the present invention, to implant nitrogen into the dielectric layer 214 via plasma doping or nitrogen plasma treatment.

After the nitrogen 218 has been implanted into the metal silicate based dielectric layer 214, the mask 216 is stripped from the metal silicate layer 214, as indicated in FIG. 2I (step 314). After the mask 216 has been stripped, a top, exposed surface of the metal silicate layer 214 can be cleaned to remove any impurities.

Annealing of the nitrogen-implanted metal silicate layer 214 is performed at a temperature of approximately between 600® C. and 900° C. for a time period approximately between 10 seconds to one hour (step 316). The annealing operates to chemically incorporate the nitrogen into the metal silicate layer 214. The nitrogen ions are schematically depicted as plus signs 220 in FIG. 2J in order to indicate their chemically incorporated nature. Because the nitrogen ions are chemically incorporated, they no longer function as defects in the dielectric layer 214.

The anneal may also mend some bonds between silicate molecules, but the primary function of the anneal is to chemically incorporate the nitrogen into the silicate structure. The incorporated nitrogen functions as a getter to absorb diffusing boron, thereby changing the properties of the dielectric layer 214.

The annealing is described herein as being rapid thermal annealing. However, it is also possible, within the scope of the present invention, for the anneal to be performed by furnace annealing.

In step 318 (FIG. 2K), the physical thickness of the metal silicate 214 is decreased by etching-back the metal silicate 214 to achieve an equivalent oxide thickness (EOT) of approximately 8–13 Angstroms. That is, the physical thickness of the metal silicate 214 is reduced until the metal silicate 214 provides a same level of capacitance as does a layer of silicon dioxide that is approximately 8–13 Angstroms thick. In one embodiment, a metal silicate 214 that is approximately 15–25 Angstroms thick has an EOT of approximately 8–13 Angstroms. By virtue of the metal silicate 214 having a higher dielectric constant K than has silicon dioxide, the metal silicate 214 can be twice as thick as a silicon dioxide dielectric and yet provide the same capacitance. In the present embodiment, the metal silicate 214 is provided with a thickness (15–25 Angstroms) that is approximately twice the thickness of a layer of silicon dioxide (8–13 Angstroms) that provides the same capacitance. Additionally, initial oxide thickness targeting must be carefully done to accommodate the final thickness of the thick oxide gate.

A very dilute solution of hydrogen fluoride (HF) and water ($H_2O$) can be used in etching the metal silicate 214. For example, the ratio of $H_2O$ to HF can be approximately 400:1.

Figure 4A:
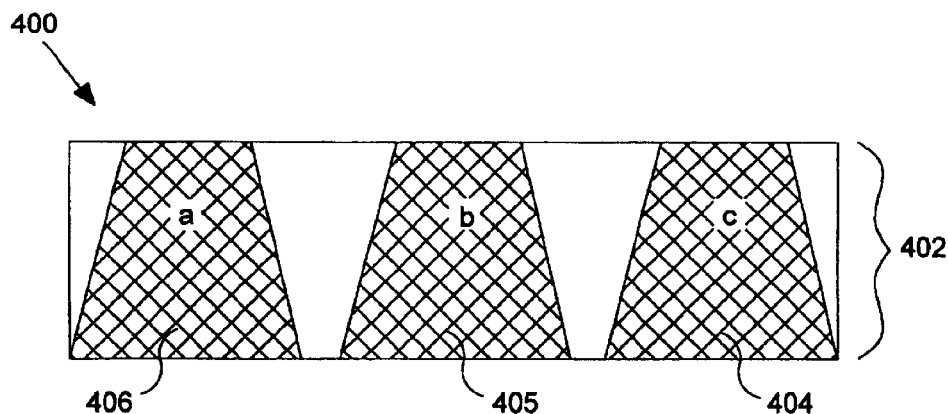
FIGS. 4A–N depict cross-sectional views of stages in the fabrication of a metal silicate based dielectric with nitrogen incorporated therein according to another preferred embodiment of the present invention.
Figure 4B:
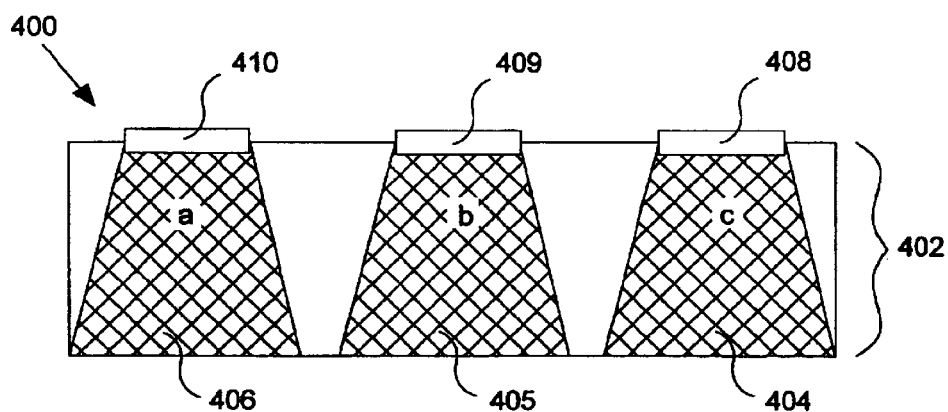
Figure 4C:
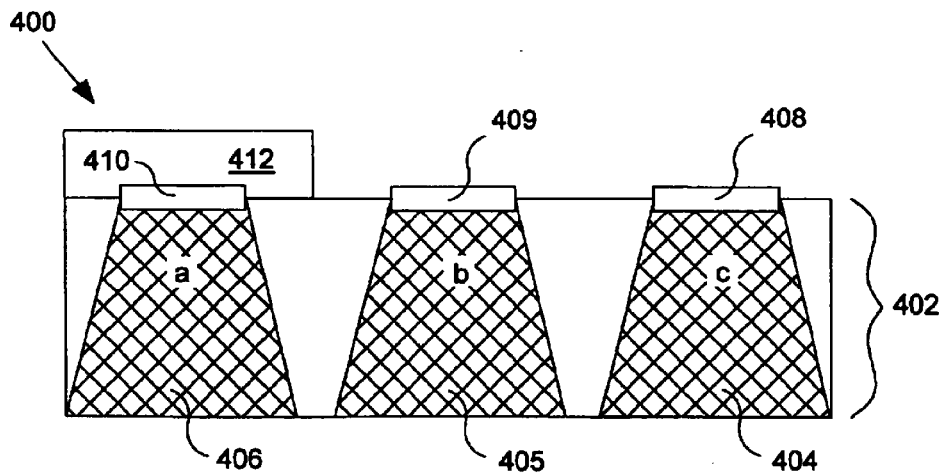
Figure 4D:
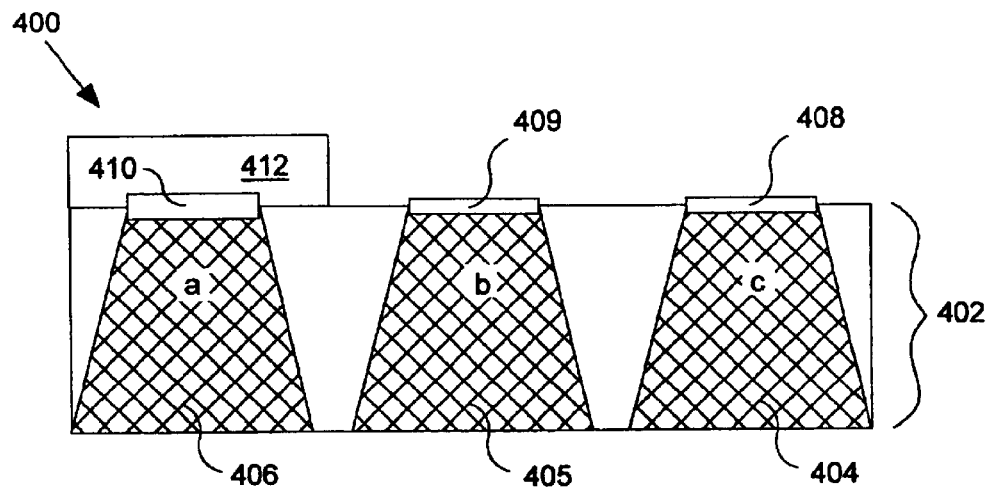
Figure 4E:
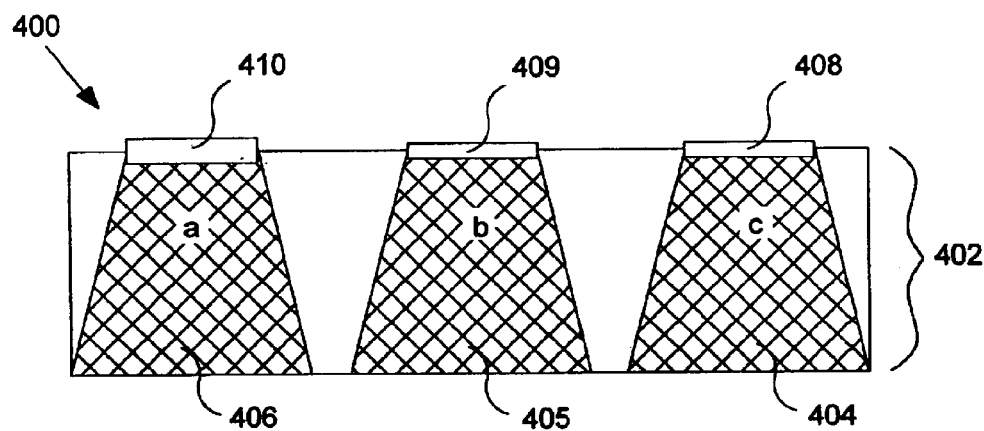
Figure 4F:
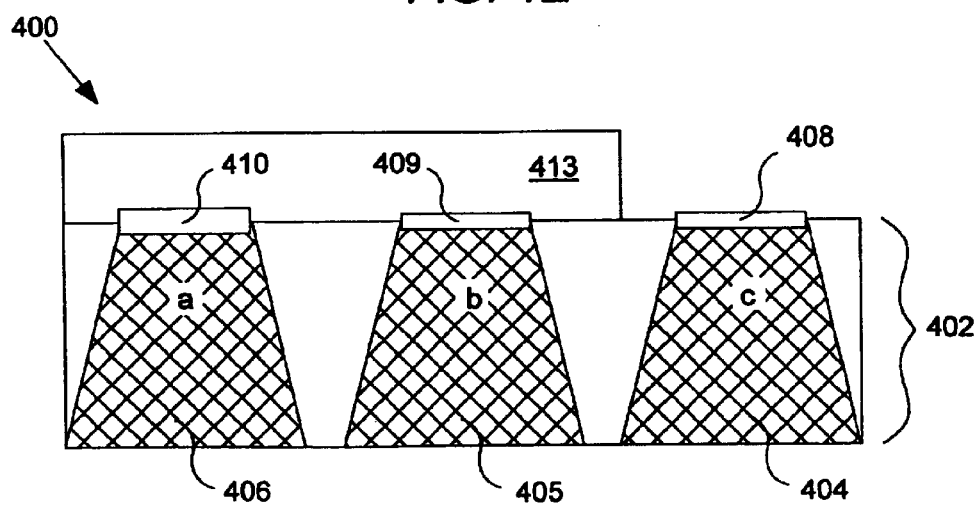
Figure 4G:
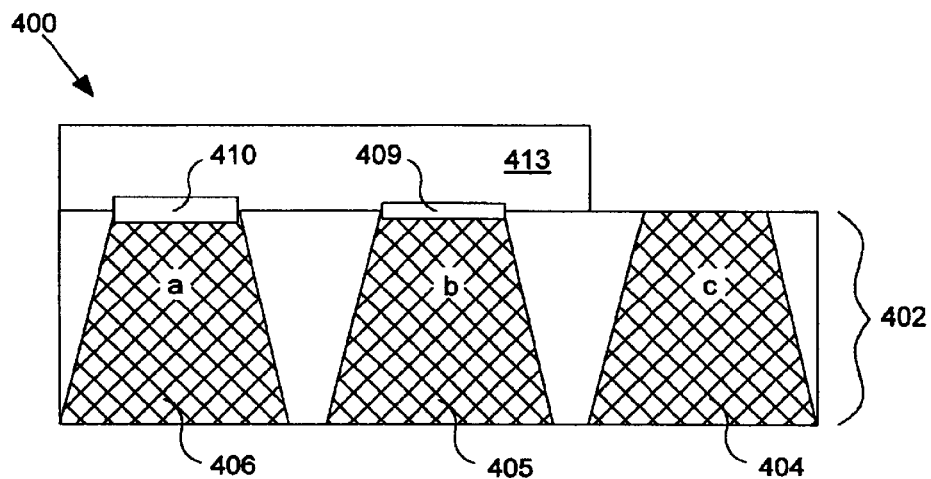
Figure 4H:
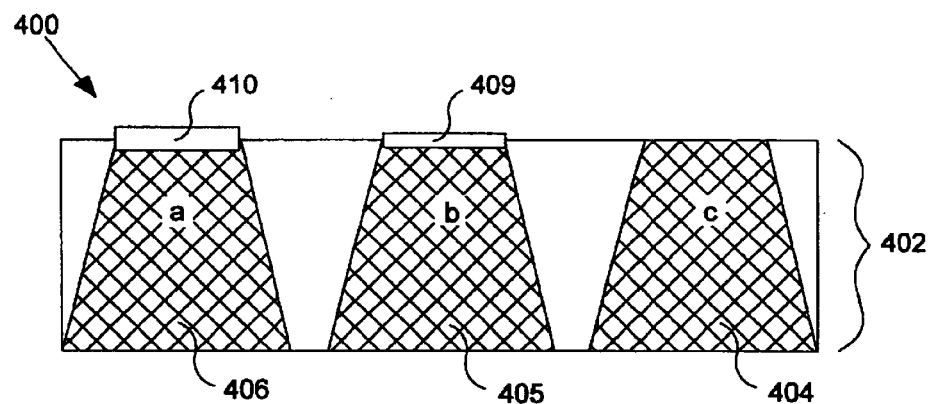
Figure 4I:
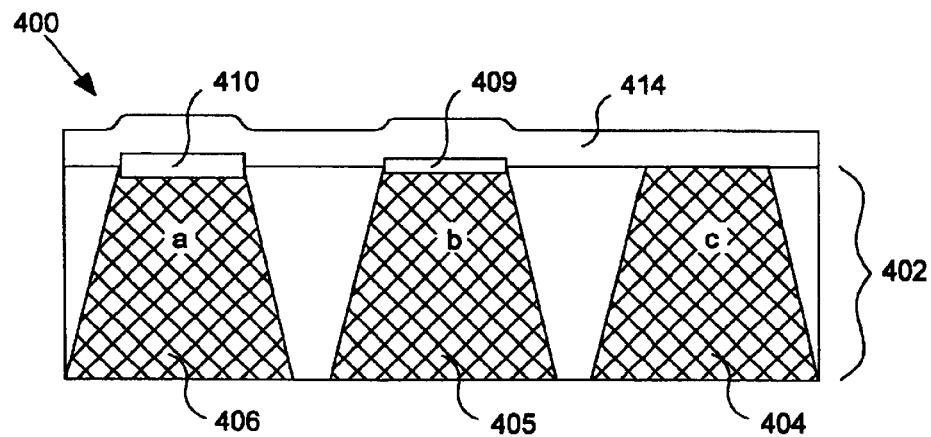
Figure 4J:
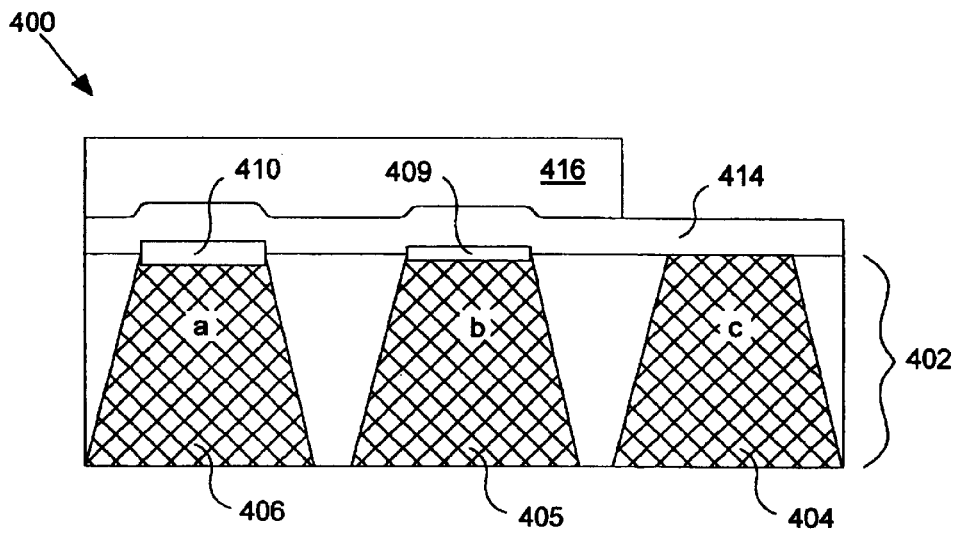
Figure 4K:
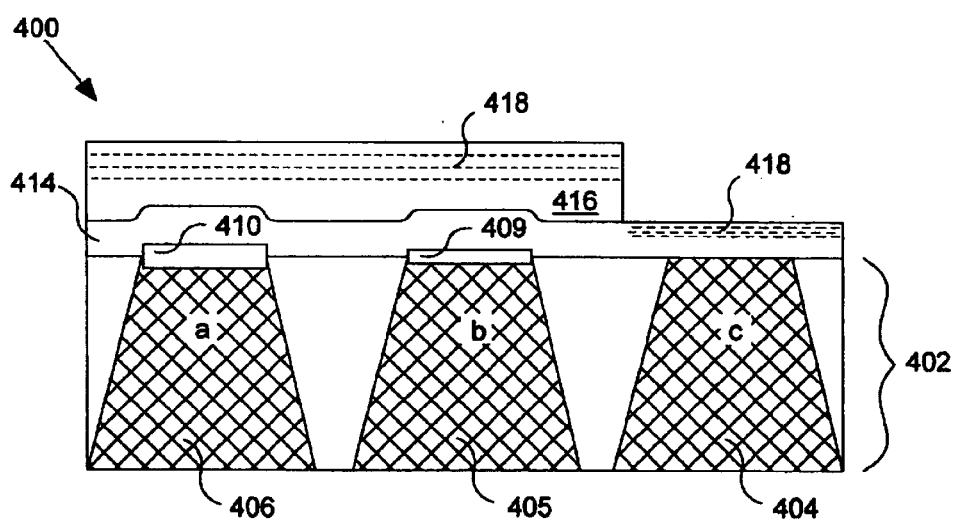
Figure 4L:
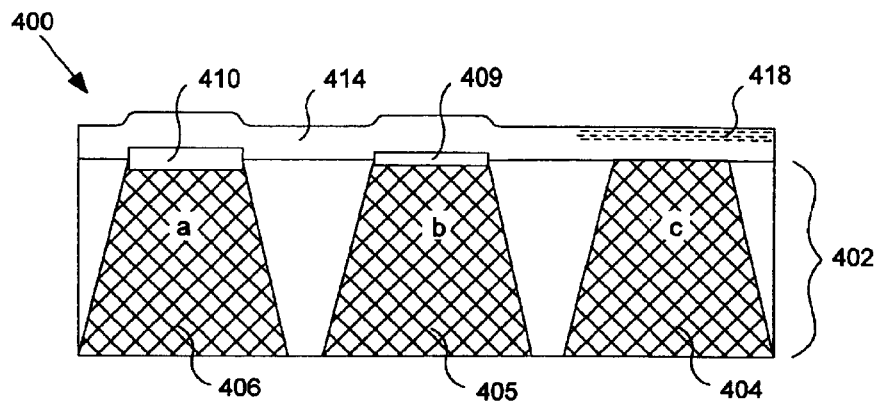
Figure 4M:
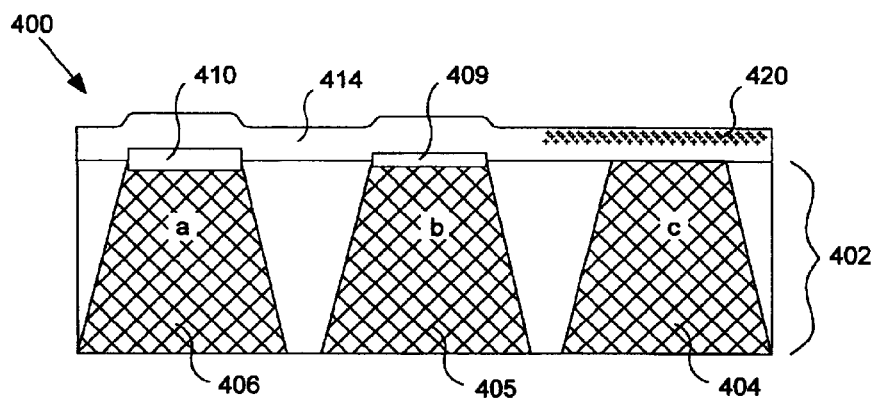
Figure 4N:
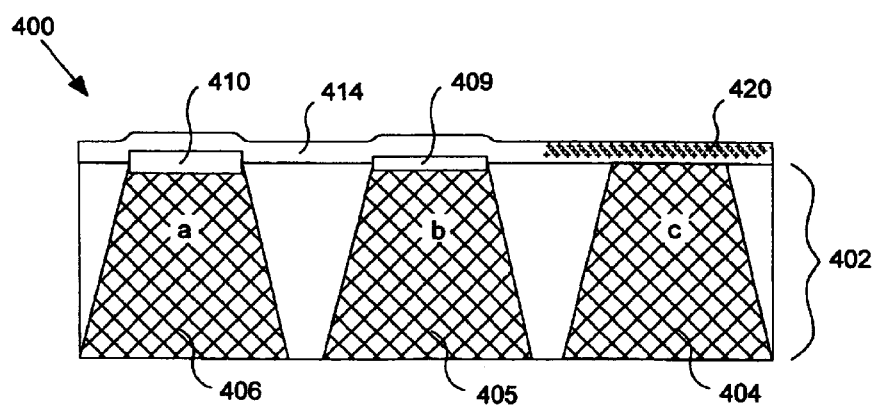

FIGS. 4A–N show stages in the fabrication of a dielectric including a metal silicate according to another preferred embodiment of the present invention, including a triple gate scheme. The fabrication process involves growth of a layer of oxide on a semiconductor wafer, masking the gate dielectric areas that are to include the thickest gate dielectrics, reducing the thickness of the oxide on the areas that are to include thin gate dielectrics and gate dielectrics of intermediate thickness, stripping of the mask on the thickest gate dielectric areas, masking the gate dielectric areas that are to include the thickest gate dielectrics and gate dielectrics of intermediate thickness, etching of the oxide on the areas that are to include thin gate dielectrics, stripping of the mask on the thickest gate dielectric areas and gate dielectric areas of intermediate thickness, the deposition of a metal silicate layer on the wafer, again masking the gate dielectric areas that are to include thickest gate dielectrics and gate dielectrics of intermediate thickness, implantation of nitrogen into the metal silicate and the mask, stripping of the mask, followed by thermal annealing of the nitrogen implanted silicate, and finally adjustment of the thickness of the silicate by etching.

Figure 5:
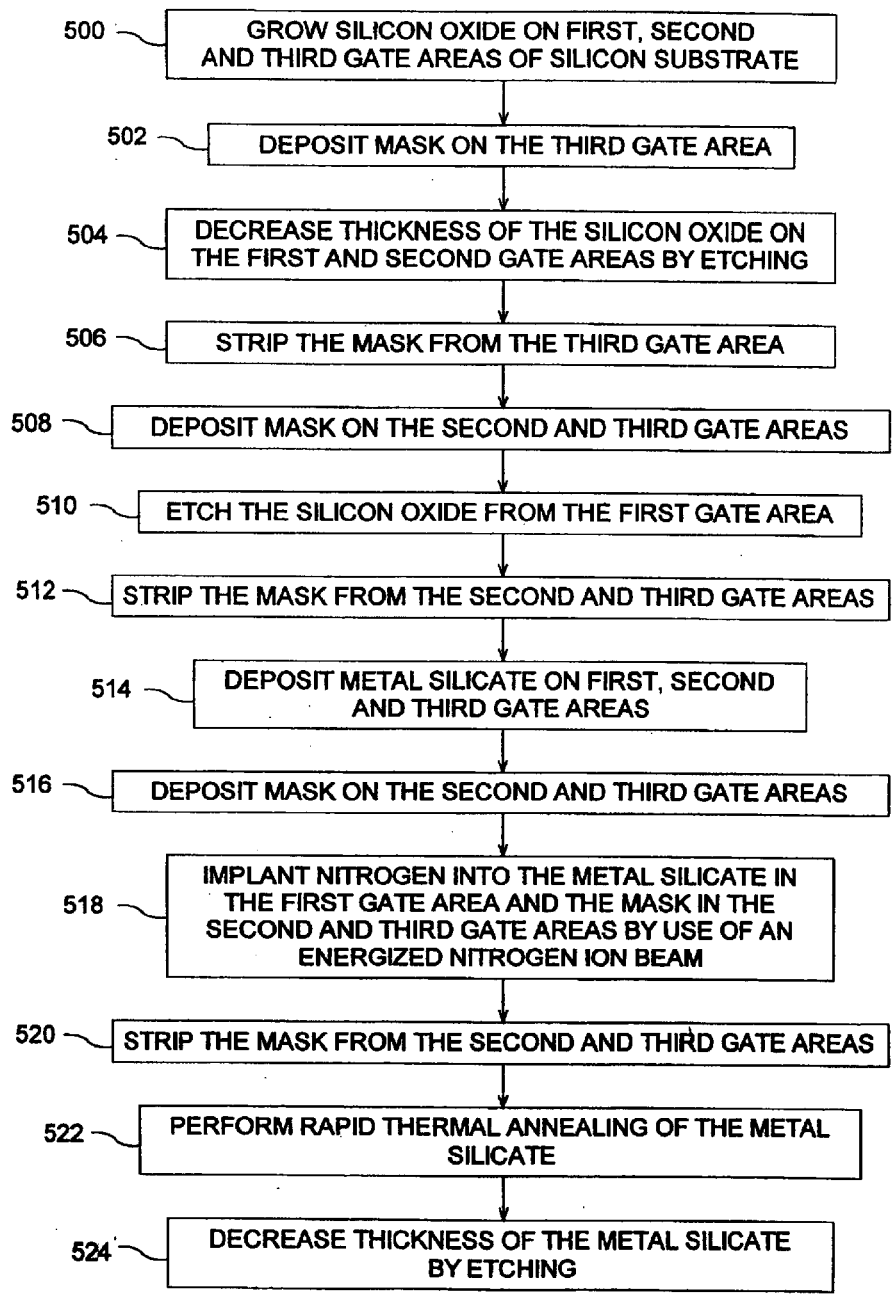
FIG. 5 is a flow chart of the preferred embodiment of the present invention depicted in FIGS. 4A–N.

FIG. 5 shows a flow diagram of operations used to form the stages of FIGS. 4A–N. The steps of FIG. 5 and the stages of FIGS. 4A–N will be described concurrently herein.

In FIG. 4A, a portion of a patterned and cleaned semiconductor wafer 400 is shown. The wafer 400 includes a gate area substrate 402, preferably composed of single crystal silicon. In a first stage of this preferred embodiment, a plurality of first island areas or first gate areas 404 of the substrate 402, a plurality of second island areas or second gate areas 405 of the substrate 402, and a plurality of third island areas or third gate areas 406 of the substrate 402 are identified by a designer of the integrated circuit chip of which the wafer 400 will be a part. Only one first gate area 404, one second gate area 405, and one third gate area 406, which are laterally separated from each other, are shown in FIGS. 4A–M for ease of illustration. Each first gate area 404 is to include a thin metal silicate dielectric, while each second gate area 405 and each third gate area 406 is to include a thicker dielectric including both a layer of silicon oxide and a layer of metal silicate.

As shown in FIG. 4B, thick layers 408, 409, 410 of silicon dioxide ($SiO_2$) or silicon oxynitride (SiON) are deposited or grown on the first gate area 404, the second gate area 405, and the third gate area 406, respectively (step 500; FIG. 5). In one embodiment, the layers 408, 409, 410 each have a thickness of approximately 45 Angstroms. Next, as shown in FIG. 4C, a mask 412 is deposited on the silicon oxide layer 410 by a known technique (step 502). The mask 412 can be comprised, for example, of a metal material or a photoresist material.

In a next step (step 504), the physical thicknesses of the silicon oxide layers 408, 409 are reduced by etching-back the silicon oxide layers 408, 409, as shown in FIG. 4D. In one embodiment, the layers 408, 409 each have a thickness of approximately 15 Angstroms after the etching-back. The mask 412 is then stripped from the silicon oxide dielectric layer 410, as indicated in FIG. 4E (step 506). Next, as shown in FIG. 4F, a mask 413 is deposited on the silicon oxide layers 409, 410 by a known technique (step 508). The mask 413 can be comprised, for example, of a metal material or a photoresist material.

In a next step (step 510), the silicon oxide layer 408 is etched off of or otherwise removed from the first gate area 404, as shown in FIG. 4G. The mask 413 is then stripped from the silicon oxide dielectric layers 409, 410, as indicated in FIG. 4H (step 512). After the mask 413 has been stripped, a top, exposed surface of the wafer 400 can be cleaned to remove any impurities.

As shown in FIG. 4I, a metal silicate based dielectric layer 414 is deposited or otherwise formed on the top surface of the wafer 400 to thereby cover the first, second and third gate areas 404, 405, 406 (step 514). The metal silicate can be in the form of $HfSiO_x$, for example. The layer 414 can be formed with a pre-selected metal-to-silicon ratio and a thickness of between 30 Angstroms and 50 Angstroms. The layer 414 can be formed with any of various techniques, such as metal organic chemical vapor deposition (MOCVD), atomic layer deposition (ALD), or physical vapor deposition (PVD).

A mask 416 (FIG. 4J) is deposited by a known technique on a portion of the metal silicate based dielectric layer 414 that is disposed above the second and third gate areas 405, 406 (step 516). The mask layer 416 can be comprised, for example, of a metal material or a photoresist material.

Next, as shown in FIG. 4K, nitrogen 418 is implanted into both the mask layer 416 and the unmasked portion of the metal silicate based dielectric layer 414 by energized nitrogen ion beam implantation (step 518). The ion implantation is performed with a dosage approximately between $10^{12}$ atoms/cm$^2$ and $10^{15}$ atoms/cm$^2$ and an ion energy approximately between 0.2 keV and 5.0 keV. The ion implantation can be performed at room temperature. The mask 416 prevents the nitrogen from being implanted into the metal silicate in the second and third gate areas, where the nitrogen could change the known and desirable properties of the thicker gate dielectrics.

The implantation of the nitrogen ions into the dielectric layer 414 does not result in the nitrogen ions being chemically incorporated into the dielectric layer 414. That is, the nitrogen ions are not bonded with the silicate. The nitrogen ions are schematically depicted as horizontal dashes 418 in FIG. 4K in order to indicate their unincorporated nature. Because the nitrogen ions are unincorporated, they function as defects in the dielectric layer 414.

The implantation of nitrogen into the dielectric layer 414 is described herein as being achieved by use of at least one ion beam. However, it is also possible, within the scope of the present invention, to implant nitrogen into the dielectric layer 414 via plasma doping or nitrogen plasma treatment.

After the nitrogen 418 has been implanted into the metal silicate based dielectric layer 414, the mask 416 is stripped from the metal silicate layer 414, as indicated in FIG. 4L (step 520). After the mask 416 has been stripped, a top, exposed surface of the metal silicate layer 414 can be cleaned to remove any impurities.

Rapid thermal annealing of the nitrogen-implanted metal silicate layer 414 is performed at a temperature of approximately between 600° C. and 900° C. for a time period approximately between 10 seconds and one hour (step 522). The annealing operates to chemically incorporate the nitrogen into the metal silicate layer 414. The nitrogen ions are schematically depicted as plus signs 420 in FIG. 4M in order to indicate their chemically incorporated nature. Because the nitrogen ions are chemically incorporated, they no longer function as defects in the dielectric layer 414. Thus, the electrical integrity of the metal silicate based dielectric layer is restored.

The anneal may also mend some bonds between silicate molecules, but the primary function of the anneal is to chemically incorporate the nitrogen into the silicate structure, i.e., chemically bond the nitrogen with the silicate. The incorporated nitrogen functions as a getter to absorb diffusing boron, thereby changing the properties of the dielectric layer 414.

The annealing is described herein as being rapid thermal annealing. However, it is also possible, within the scope of the present invention, for the anneal to be performed by furnace annealing. In step 524 (FIG. 4N), the physical thickness of the metal silicate 414 is decreased by etching-back the metal silicate 414 to achieve an equivalent oxide thickness (EOT) of approximately 8–13 Angstroms. That is, the physical thickness of the metal silicate 414 is reduced until the metal silicate 414 provides a same level of capacitance as does a layer of silicon dioxide that is approximately 8–13 Angstroms thick. In one embodiment, a metal silicate 414 that is approximately 25 Angstroms thick has an EOT of approximately 12–13 Angstroms. By virtue of the metal silicate 414 having a higher dielectric constant K than has silicon dioxide, the metal silicate 414 can be twice as thick as a silicon dioxide dielectric and yet provide the same capacitance. In the present embodiment, the metal silicate 414 is provided with a thickness (25 Angstroms) that is approximately twice the thickness of a layer of silicon dioxide (12–13 Angstroms) that provides the same capacitance. Additionally, initial oxide thickness targeting must be carefully done to accommodate the final thickness of the thick oxide gate.

A very dilute solution of hydrogen fluoride (HF) and water ($H_2O$) can be used in etching the metal silicate 414. For example, the ratio of $H_2O$ to HF can be approximately 400:1.

The present invention allows the percentage of nitrogen incorporation to be controlled (first requirement) by selecting a suitable nitrogen dose for a predetermined thickness of the metal silicate dielectric. As disclosed in the embodiments described above, a suitable dose of nitrogen for a metal silicate dielectric having a thickness range of 30–50 Angstroms is $10^{12}$–$10^{15}$ atoms/$cm^2$.

The present invention also allows the spatial distribution of the nitrogen in the metal silicate dielectric to be controlled (second requirement) by choosing a suitable energy range of the nitrogen ions. As disclosed in the embodiments described above, a suitable energy range of the nitrogen ions for a metal silicate dielectric having a thickness range of 30–50 Angstroms is 0.2–5.0 keV.

The present invention further allows the location of nitrogen incorporation to be selected (third requirement). Since the nitrogen incorporation process can be carried out at room temperature, selection of the nitrogen incorporation location, i.e., the portion of the metal silicate dielectric that is disposed above the first gate area, can be implemented conveniently by masking the location that is not to receive nitrogen, i.e., the portion of the metal silicate dielectric that is disposed above the second gate area and, in the case of the triple gate system, the third gate area.

The method of the present invention enables direct and selective incorporation, concentration control and spatial distribution control of nitrogen in metal silicate based dielectrics by energized nitrogen ion beams. The method also uses annealing for incorporating the implanted nitrogen into the metal silicate layer.

The method of the present invention provides a simple, effective technique for improving the performance of CMOS devices using metal silicate based dielectrics. The method has several advantages over known techniques of nitrogen implantation. One advantage is that the method enables the percentage of nitrogen incorporation in the dielectrics to be controlled accurately (first requirement). Ion beam processing, especially ion beam processing including nitrogen implantation, allows the percentage of nitrogen incorporation in the dielectrics to be controlled accurately.

Another advantage of the method of the present invention is that the profile of nitrogen in the dielectrics can be tailored according to the performance requirements of the CMOS devices by reliably adjusting the energy range of the ions (second requirement). Yet another advantage is that the location of the nitrogen incorporation can be selected conveniently with minimum impact on existing transistor fabrication process flows (third requirement).

A further advantage of the method of the present invention is that the thickness of the dielectrics can be adjusted by the hydrogen fluoride etching step. Thus, the method does not rely on the deposition technique of metal silicates to control the thickness of the dielectric. The method is therefore a versatile technique that can be used for different integrated circuit technologies.

A still further advantage of the method of the present invention is that it requires only tools that are readily available in typical semiconductor fabrication facilities. For example, ion beam tools, such as implanters, are among the available tools in semiconductor fabrication facilities. Also, nitrogen is a common source gas and is easily introduced into ion beam tools. Thus, the method of the present invention can improve the performance of CMOS devices without requiring capital investments.

While the invention is susceptible to various modifications and alternative forms, a specific embodiment thereof has been shown by way of example in the drawings and will herein be described in detail. It should be understood, however, that there is no intent to limit the invention to the particular form disclosed, but on the contrary, the intention is to cover all modifications, equivalents, and alternatives falling within the spirit and scope of the invention as defined by the appended claims.

What is claimed is:

1. A method of making a thin gate dielectric comprising:
   providing a metal silicate on a silicon substrate;
   implanting nitrogen into the metal silicate; and
   decreasing a thickness of the metal silicate to approximately between 15 Angstroms and 30 Angstroms.

2. The method of claim 1, comprising the further step of annealing the metal silicate.

3. The method of claim 2, wherein the annealing step is performed at a temperature of approximately between 600° C. and 900° C.

4. The method of claim 2, wherein the annealing step is performed for a time period of approximately between 10 seconds and one hour.

5. The method of claim 2, wherein the annealing step chemically incorporates the nitrogen into the metal silicate.

6. The method of claim 1, wherein the implanting step includes use of at least one ion beam.

7. The method of claim 6, comprising the further step of choosing an energy of the at least one ion beam to thereby control a spatial distribution of the nitrogen in the metal silicate.

8. The method of claim 1, wherein the implanting step is performed with a dosage of approximately between 1012 atoms/cm2 and 1015 atoms/cm2.

9. The method of claim 1, wherein the implanting step is performed with an ion energy of approximately between 0.2 keV and 5.0 keV.

10. The method of claim 1, further comprising the steps of:
    providing a mask on a portion of the metal silicate before the implanting step; and
    stripping the mask from the metal silicate after the implanting step.

11. The method of claim 10, wherein the mask prevents the nitrogen from being implanted into the portion of the metal silicate.

12. The method of claim 1, wherein the step of providing a metal silicate on a silicon substrate further comprises providing the metal silicate with a thickness of approximately between 30 Angstroms and 50 Angstroms.

13. The method of claim 12, wherein the step of providing a metal silicate on a silicon substrate further comprises providing the metal silicate with a thickness of approximately 40 Angstroms.

14. The method of claim 1, wherein the step of decreasing a thickness of the metal silicate to approximately between 15 Angstroms and 30 Angstroms comprises:
    decreasing a thickness of the metal silicate by chemical etching.

15. A method of making a semiconductor, comprising:
  providing a dielectric on a substrate, the dielectric having metal content;
  implanting nitrogen ions into the dielectric;
  annealing the dielectric; and
  decreasing the thickness of the dielectric to approximately between 15 Angstroms and 30 Angstroms.

16. The method of claim 15, wherein the annealing step chemically incorporates the nitrogen into the dielectric.

17. The method of claim 15, wherein the annealing step includes rapid thermal annealing.

18. The method of claim 15, wherein the annealing step is performed at a temperature of approximately between 600° C. and 900° C.

19. The method of claim 15, wherein the annealing step is performed for a time period of approximately between 10 seconds and 1 hour.

20. A thin gate dielectric created by the steps of:
  providing a metal silicate on a silicon substrate;
  implanting nitrogen into the metal silicate;
  annealing the metal silicate; and
  reducing the metal silicate to a thickness of approximately between 15 Angstroms and 30 Angstroms.

21. The thin gate dielectric of claim 20, wherein the metal silicate is provided with a thickness of approximately 40 angstroms.

* * * * *